(12) United States Patent
Wang et al.

(10) Patent No.: US 8,193,613 B2
(45) Date of Patent: Jun. 5, 2012

(54) SEMICONDUCTOR DIE HAVING INCREASED USABLE AREA

(75) Inventors: Ken Jian Ming Wang, San Francisco, CA (US); Ming Wang Sze, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 1035 days.

(21) Appl. No.: 11/715,241

(22) Filed: Mar. 6, 2007

(65) Prior Publication Data

US 2008/0220220 A1    Sep. 11, 2008

(51) Int. Cl.
*H01L 23/544* (2006.01)

(52) U.S. Cl. ........ 257/620; 257/E23.179; 257/773; 438/460

(58) Field of Classification Search ........ 257/E23.179, 257/620, 773, 784, 786; 428/192; 438/460, 438/462–465, 617
See application file for complete search history.

(56) References Cited

U.S. PATENT DOCUMENTS

| | | | | |
|---|---|---|---|---|
| 4,990,462 A | * | 2/1991 | Sliwa, Jr. | 438/107 |
| 5,539,246 A | * | 7/1996 | Kapoor | 257/618 |
| 5,859,448 A | * | 1/1999 | Brassington | 257/203 |
| 6,030,885 A | * | 2/2000 | Bothra | 438/460 |
| 6,043,134 A | * | 3/2000 | Bishop | 438/401 |
| 6,153,506 A | * | 11/2000 | Kermani | 438/617 |
| 6,287,949 B1 | * | 9/2001 | Mori et al. | 438/612 |
| 6,407,434 B1 | * | 6/2002 | Rostoker et al. | 257/401 |
| 6,500,696 B2 | * | 12/2002 | Sutherland | 438/109 |
| 6,570,243 B1 | * | 5/2003 | Hagihara | 257/620 |
| 6,924,210 B1 | * | 8/2005 | Daubenspeck et al. | 438/460 |
| 7,771,532 B2 | * | 8/2010 | Uematsu et al. | 117/84 |
| 2006/0278956 A1 | * | 12/2006 | Cadouri | 257/620 |
| 2010/0072578 A1 | * | 3/2010 | Kunishima | 257/620 |

FOREIGN PATENT DOCUMENTS

JP     03163817 A  *  7/1991

* cited by examiner

*Primary Examiner* — Chris Chu

(74) *Attorney, Agent, or Firm* — Farjami & Farjami LLP

(57) ABSTRACT

According to one embodiment, a semiconductor die having increased usable area has at least six sides. The semiconductor die has a reduced stress at each corner of the die, resulting in smaller keep out zones near the corners of the semiconductor die, which allow the placement of bond pads near each corner of the die. The semiconductor die further allows the placement of active circuitry near each corner of the semiconductor die. One embodiment results in a 5.0% increase in usable area on the semiconductor die.

19 Claims, 3 Drawing Sheets

SEMICONDUCTOR DIE HAVING INCREASED USABLE AREA

BACKGROUND OF THE INVENTION

1. Field of the Invention

The present invention is generally in the field of semiconductors. More particularly, the present invention is in the field of semiconductor die fabrication.

2. Background

Conventional semiconductor dies are typically designed to have a square or rectangular shape to facilitate the die fabrication and dicing processes. However, the corners of conventional semiconductor dies are subjected to high stress during various phases of the manufacturing process. Potential sources of high stress include probe card testing, die singulation, general die handling (such as "pick and place" processes), injection molding, wire bonding, and die packaging processes. High stress imposed on the corners of a die results in a high failure rate of circuits and bond pads placed close to the corners. As such, "keep out zones" are defined near the corners of each semiconductor die, which designate an area where bond pads or other circuitry should not be placed.

As semiconductor manufacturers attempt to increase the functionality of semiconductor dies, additional bond pads are typically required on the dies to implement such increases in functionality. As a consequence, due to the increasing demand for additional bond pads for signal, ground, and power distribution, there is an increasing demand for a more efficient use of die space to accommodate such additional bond pads. Moreover, as semiconductor dies are continuously reduced in size to meet industry demands, the already limited areas for the placement of bond pads on the semiconductor dies are becoming increasingly smaller.

SUMMARY OF THE INVENTION

A semiconductor die having increased usable area, substantially as shown in and/or described in connection with at least one of the figures, as set forth more completely in the claims.

DETAILED DESCRIPTION OF THE INVENTION

The present invention is directed to a semiconductor die having increased usable area. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
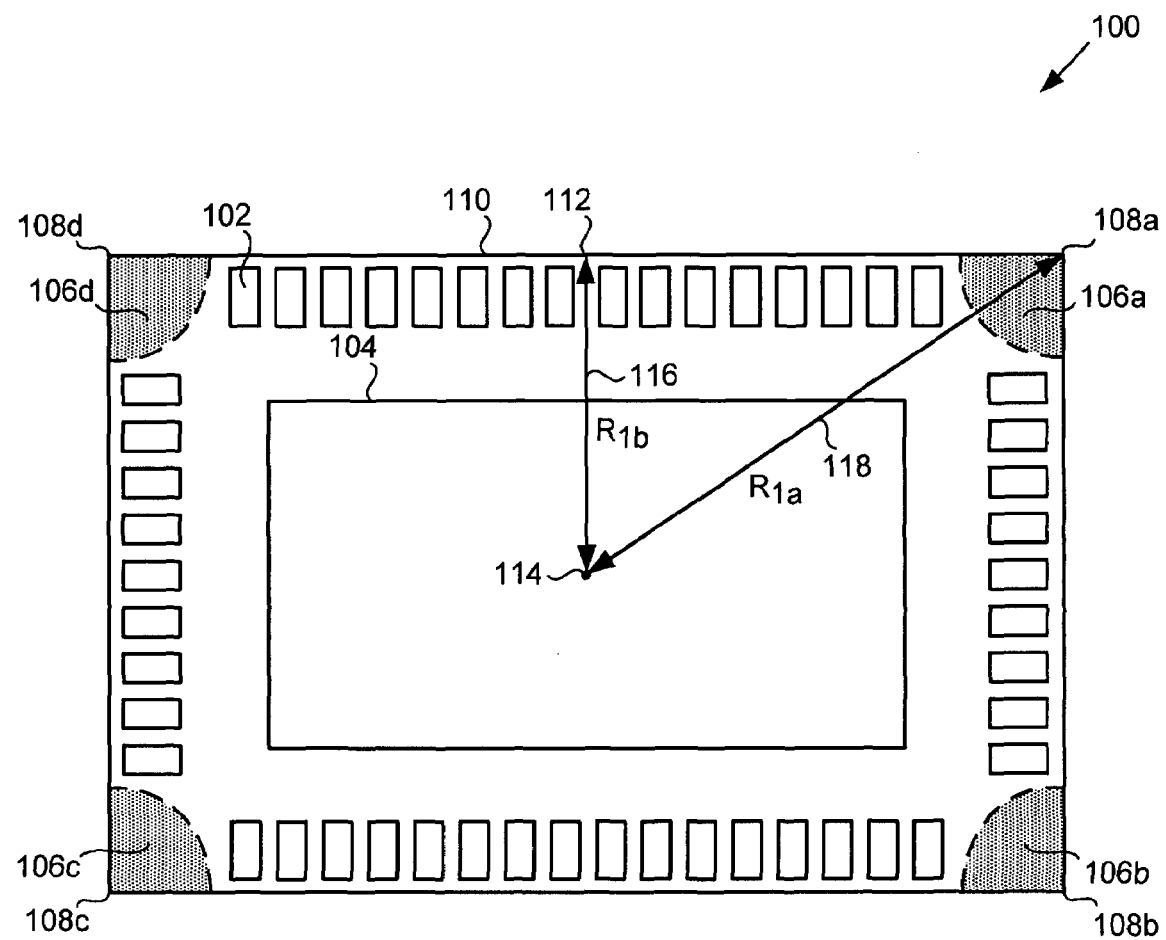
FIG. 1 shows a conventional semiconductor die.

FIG. 1 shows a conventional semiconductor die. As shown in FIG. 1, conventional die 100 is rectangular and includes a number of bond pads, such as bond pad 102 (also referred to as "bond pads 102"), and core 104. As also shown in FIG. 1, conventional die 100 includes a number of "keep out zones," such as keep out zones 106a, 106b, 106c, and 106d situated at corners 108a, 108b, 108c, and 108d, respectively. Each keep out zone in FIG. 1 defines an area in which neither bond pads nor active circuitry may be placed. Thus, as shown in FIG. 1, the large keep out zones of conventional die 100 significantly reduces the usable area on the conventional semiconductor die.

An important factor used in determining the size of a keep out zone on a die is the amount of stress imposed at the corners of the die. In FIG. 1, for example, distance 118 (also referred to as "$R_{1a}$") represents the distance from the center of conventional die 100, i.e. center 114, to corner 108a and distance 116 (also referred to as "$R_{1b}$") represents the distance from center 114 to the center of side 110 situated at point 112. Thus, $R_{1b}$ represents the shortest distance from center 114 to side 110. Since the ratio $R_{1a}/R_{1b}$ is significantly greater than 1.0, i.e. since $R_{1a}$ is significantly larger than $R_{1b}$, the stress imposed at corner 108a is substantially higher than the stress imposed at point 112. Consequently, an undesirably large keep out zone, i.e. keep out zone 106a, is defined at corner 108a to prevent malfunction or failure of the die as a result of high stresses imposed at corner 108a. Accordingly, similar sized keep out zones, i.e. keep out zones 106b, 106c, and 106d, are defined at the other corners of conventional die 100.

Figure 2:
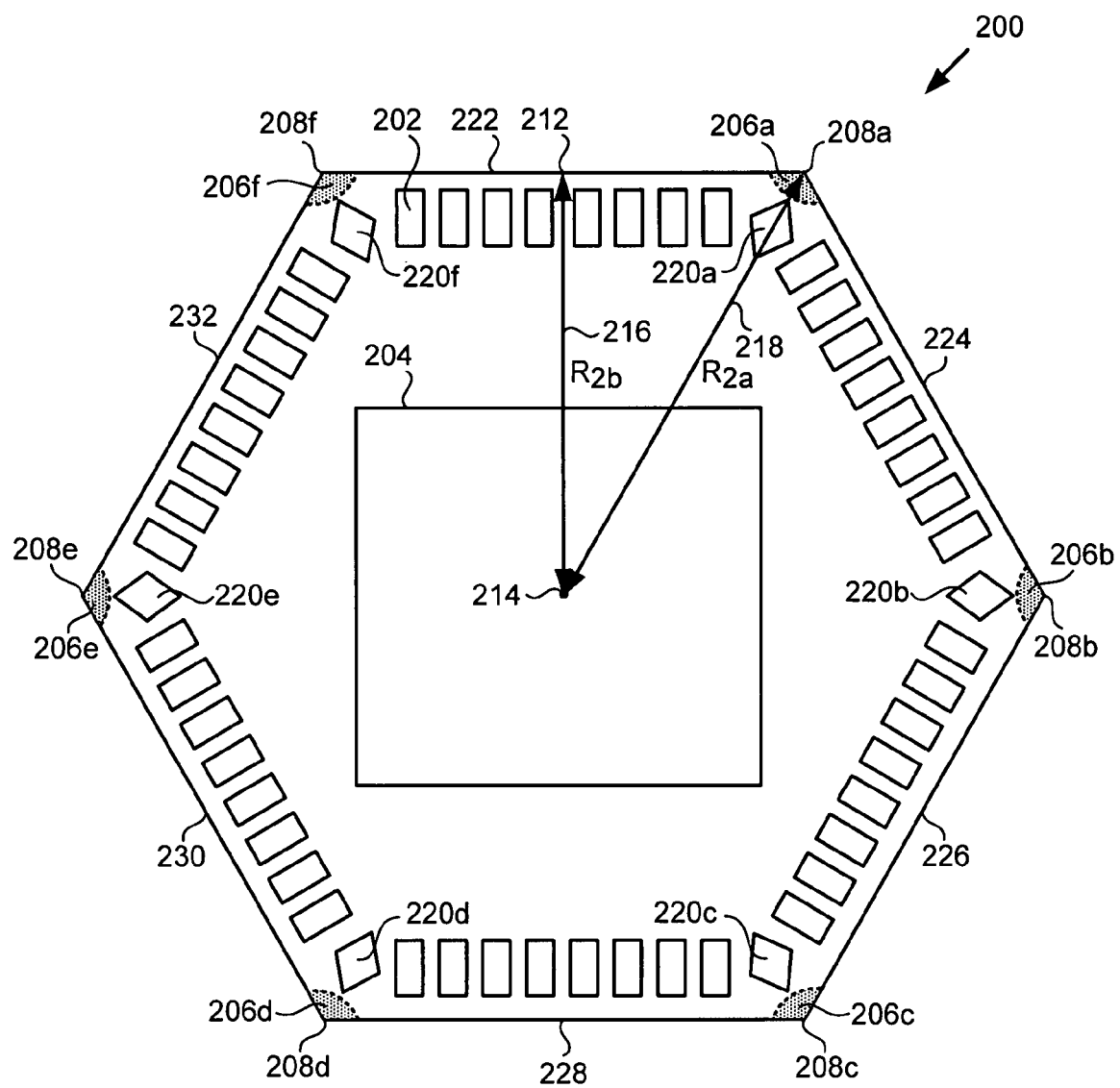
FIG. 2 shows a semiconductor die having increased usable area in accordance with one embodiment of the invention.

FIG. 2 shows a semiconductor die having increased usable area in accordance with one embodiment of the invention. As shown in FIG. 2, hexagonal semiconductor die 200 includes a number of bond pads, e.g. bond pad 202 (also referred to as "bond pads 202"), and core 204. In the embodiment shown in FIG. 2, core 204 has a square shape. In other embodiments, core 204 can have a rectangular or hexagonal shape, or any other appropriate shape. As also shown in FIG. 2, hexagonal semiconductor die 200 has six sides, i.e. sides 222, 224, 226, 228, 230, and 232. In one embodiment, semiconductor die 200 can be a regular hexagon, i.e. a hexagon having sides of equal length. In other embodiments, semiconductor die 200 can be a non-regular hexagon or it can have more than six sides such as, for example, an octagon. As further shown in FIG. 2, hexagonal semiconductor die 200 includes a number of keep out zones, such as keep out zones 206a, 206b, 206c, 206d, 206e, and 206f situated at corners 208a, 208b, 208c, 208d, 208e, and 208f, respectively. As discussed above, each keep out zone in FIG. 2 defines an area in which neither bond pads nor active circuitry may be placed.

Hexagonal semiconductor die 200 shown in FIG. 2 can be conveniently diced using various die singulation processes. For example, semiconductor die 200 can be diced using water-jet-guided laser technology, which involves the use of a low-pressure water jet that guides a laser beam. The water prevents thermal damage to the die as the laser beam cuts through the wafer (not shown in FIG. 2). Accordingly, the water jet can be configured to follow the perimeter of semiconductor die 200 on a wafer to allow the laser to cut semiconductor die 200.

As another example of achieving semiconductor die 200 in FIG. 2, scribe lines can be formed around the six sided perimeter of semiconductor die 200 on a wafer. Thereafter, a number of perforations are formed within the scribe lines using a low power laser beam. After the perforations are made, tension can be applied to the wafer to separate semiconductor die 200 from the wafer. Regardless of the approach taken to form and dice semiconductor die 200, it is manifest that the invention's semiconductor die 200 can be enclosed and used in various semiconductor packages after forming and dicing of the die.

FIGS. 1 and 2 can be used to compare the corner stress of conventional die 100 and hexagonal semiconductor die 200. In FIG. 2, for example, distance 218 (also referred to as "$R_{2a}$") represents the distance from the center of semiconductor die 200, i.e. center 214, to corner 208a and distance 216 (also referred to as "$R_{2b}$") represents the distance from center 214 to the center of side 222 situated at point 212. $R_{2b}$ represents the shortest distance from center 214 to side 222; Thus, since the ratio $R_{2a}/R_{2b}$ for hexagonal semiconductor die 200 of the invention is much closer to 1.0 compared to the ratio $R_{1a}/R_{1b}$ for conventional die 100 shown in FIG. 1, the stress suffered at the corners of semiconductor die 200, e.g. the stress suffered at corner 208a, is significantly lower than the stress suffered at the corners of conventional die 100, e.g. the stress suffered at corner 108a. As shown in FIG. 2, due to the reduced stress at each corner of semiconductor die 200, keep out zones 206a, 206b, 206c, 206d, 206e, and 206f of semiconductor die 200 are each substantially smaller than the keep out zones of conventional die 100, such as keep out zone 106a in FIG. 1. As such, semiconductor die 200 of the invention provides more usable area than conventional die 100. For example, semiconductor die 200 can provide a 5.0% increase in usable area over conventional die 100. Thus, since the keep out zones in semiconductor die 200 are smaller, additional active circuitry or bond pads may be included on the surface of hexagonal semiconductor die 200, such as additional bond pads 220a, 220b, 220c, 220d, 220e, and 220f (hereinafter "bond pads 220a through 220f"). In the embodiment shown in FIG. 2, additional bond pads 220a through 220f are diamond-shaped. In other embodiments, bond pads 220a through 220f can have any other suitable shapes or sizes.

Figure 3:
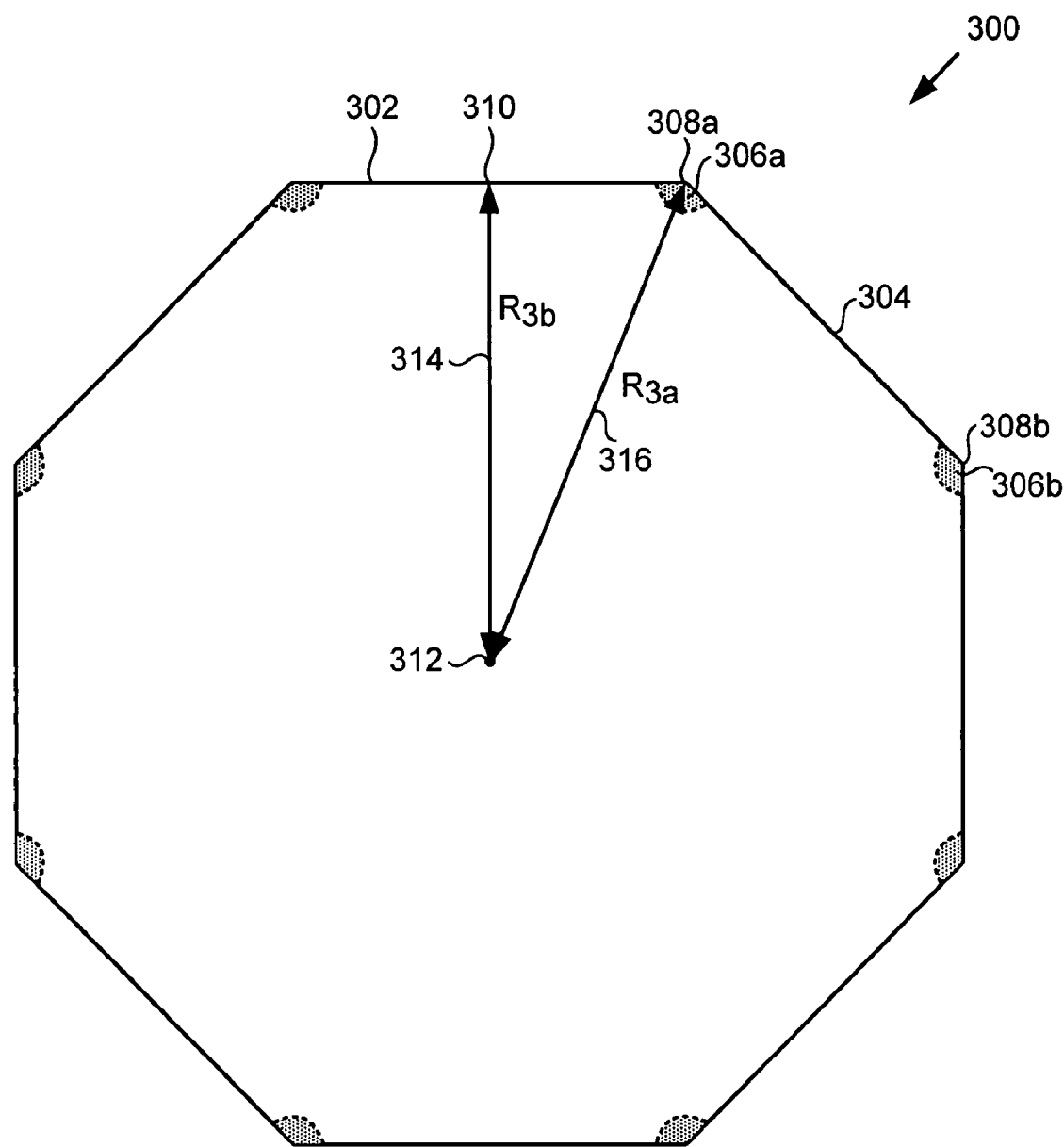
FIG. 3 shows a semiconductor die having increased usable area in accordance with one embodiment of the invention.

FIG. 3 shows a semiconductor die having increased usable area in accordance with one embodiment of the invention. As shown in FIG. 3, octagonal semiconductor die 300 has eight sides, such as sides 302 and 304. As further shown in FIG. 3, octagonal semiconductor die 300 includes a number of keep out zones, such as keep out zones 306a and 306b, which are situated at corners 308a and 308b, respectively. As discussed above, each keep out zone in FIG. 3 defines an area in which neither bond pads nor active circuitry may be placed.

As shown in FIG. 3, octagonal semiconductor die 300 also has smaller keep out zones than conventional die 100 in FIG. 1, due to a further reduction of stress imposed at each corner of semiconductor die 300. For example, distance 316 (also referred to as "$R_{3a}$") represents the distance from the center of semiconductor die 300, i.e. center 312, to corner 308a and distance 314 (also referred to as "$R_{3b}$") represents the distance from center 312 to the center of side 302 situated at point 310. $R_{3b}$ represents the shortest distance from center 312 to side 302. Thus, since the ratio $R_{3a}/R_{3b}$ for semiconductor die 300 is much closer to 1.0 compared to the ratio $R_{1a}/R_{1b}$ for conventional die 100, the stress suffered at the corners of octagonal semiconductor die 300, e.g. the stress suffered at corner 308a, is significantly lower than the stress suffered at the corners of conventional die 100, e.g. the stress suffered at corner 108a. As shown in FIG. 3, due to the reduced stress at each corner of semiconductor die 300, the keep out zones of semiconductor 300, e.g. keep out zones 306a and 306b, are each substantially smaller than the keep out zones of conventional die 100, e.g. keep out zone 106a in FIG. 1. Therefore, it can be appreciated that as an alternative embodiment to hexagonal die 200, and octagonal die 300 can be used.

It is also noted that the corners of a die generally represent its highest stress points. As a consequence, reduction of stress at the corners has a profound effect on reducing die failure rate due to excessive stress imposed during, for example, semiconductor fabrication and packaging. As noted earlier, potential sources of such imposed stress include probe card testing, die singulation, general die handling (such as "pick and place" processes), injection molding, wire bonding, and die packaging processes.

Thus, as shown in FIGS. 2 and 3, a semiconductor die having six or eight sides achieves substantially reduced stress at each corner of the die as compared to the stress at each corner of a conventional die. As a result, a semiconductor die with six or eight sides advantageously allows for substantially smaller keep out zones than a conventional four sided semiconductor die, such as conventional die 100 in FIG. 1. Consequently, the six or eight sided-semiconductor dies of the present invention provide more usable area for bond pads or active circuitry than can be achieved with conventional dies. Manifestly, semiconductor dies having different number of sides that also result in a reduced corner stress can be used in accordance with the teachings of the present invention.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail, and additional steps can be taken, without departing from the spirit and the scope of the invention. For example, it is manifest that the invention's semiconductor dies 200 and 300 can be enclosed and used in various semiconductor packages after dicing of the dies. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a semiconductor die having increased usable area has been described.

The invention claimed is:

1. A semiconductor die having increased bond pad area, at least six sides, a shortest distance from a center of said semiconductor die to one of said at least six sides, Rb, and a distance from said center to a corner, Ra, wherein said semiconductor die has a keep out zone at said corner, in which no bond pad is placed, said keep out zone being determined by a ratio of Ra/Rb that is between 1 and $2/\sqrt{3}$, and a bond pad that is placed at least partially in an area that would otherwise have been in said keep out zone, had said ratio Ra/Rb been greater than or equal to $2/\sqrt{2}$.

2. The semiconductor die of claim 1 wherein said semiconductor die allows placement of active circuitry near each said corner of said semiconductor die while reducing stress at each corner of said semiconductor die.

3. The semiconductor die of claim 1 wherein said semiconductor die has a 5.0% increase in usable area due to said ratio of Ra/Rb.

4. The semiconductor die of claim 1 wherein said semiconductor die is diced using a water-jet-guided laser.

5. The semiconductor die of claim 1 wherein said semiconductor die is diced by forming a perforation in a semiconductor wafer around a perimeter of said semiconductor die.

6. The semiconductor die of claim 1 wherein said semiconductor die is a regular hexagon.

7. The semiconductor die of claim 1 wherein said semiconductor die includes a substantially hexagonal core.

8. The semiconductor die of claim 1 wherein said semiconductor die is enclosed in a semiconductor package.

9. A first semiconductor die having increased bond pad area, at least six sides, a shortest distance from a center of said first semiconductor die to one of said at least six sides, Rb, and a distance from said center to a corner, Ra, wherein said first semiconductor die has a keep out zone at said corner, in which no bond pad is placed, said keep out zone being determined by a ratio of Ra/Rb that is between 1 and $2/\sqrt{3}$, and a bond pad that is placed at least partially in an area that would otherwise have been in said keep out zone, had said ratio Ra/Rb been greater than or equal to $2/\sqrt{2}$, each said at least six sides being in common with one of at least six sides of a second semiconductor die adjacent to said first semiconductor die.

10. The semiconductor die of claim 9 wherein said first semiconductor die is diced using a water-jet-guided laser.

11. The semiconductor die of claim 9 wherein said first semiconductor die is diced by forming a perforation in a semiconductor wafer around a perimeter of said first semiconductor die.

12. The semiconductor die of claim 9 wherein said first semiconductor die is a regular hexagon.

13. The semiconductor die of claim 9 wherein said first semiconductor die includes a substantially hexagonal core.

14. The semiconductor die of claim 9 wherein said first semiconductor die is enclosed in a semiconductor package.

15. A first semiconductor die having increased bond pad area, at least eight sides, a shortest distance from a center of said first semiconductor die to one of said at least eight sides, Rb, and a distance from said center to a corner, Ra, wherein said semiconductor die has a keep out zone at said corner, in which no bond pad is placed, said keep out zone being determined by a ratio of Ra/Rb that is between 1 and $$\frac{2}{\sqrt{2+\sqrt{2}}},$$

, and a bond pad that is placed at least partially in an area that would otherwise have been in said keep out zone, had said ratio Ra/Rb been greater than or equal to $2/\sqrt{2}$, each of said at least eight sides being in common with one of at least eight sides of a second semiconductor die adjacent to said first semiconductor die.

16. The semiconductor die of claim 15 wherein said first semiconductor die is diced using a water-jet-guided laser.

17. The semiconductor die of claim 15 wherein said first semiconductor die is diced by forming a perforation in a semiconductor wafer around a perimeter of said first semiconductor die.

18. The semiconductor die of claim 15 wherein said first semiconductor die is a regular octagon.

19. The semiconductor die of claim 15 wherein said first semiconductor die is enclosed in a semiconductor package.

\* \* \* \* \*